United States Patent [19]

Severt et al.

[11] Patent Number: 5,432,705
[45] Date of Patent: Jul. 11, 1995

[54] ADMINISTRATIVE COMPUTER AND TESTING APPARATUS

[75] Inventors: David Severt, Spokane, Wash.; George Siegner, Post Falls; Daren Upchurch, Coeur D'Alene, both of Id.; William Erler, Spokane, Wash.

[73] Assignee: Itronix Corporation, Spokane, Wash.

[21] Appl. No.: 709,033

[22] Filed: May 31, 1991

[51] Int. Cl.⁶ .................... G06F 17/60; G01R 15/12; H04M 1/24
[52] U.S. Cl. .................... 364/481; 364/483; 379/21
[58] Field of Search ........... 364/481, 483, 487, 580; 379/1, 21, 27, 28, 29, 30, 31, 107; 371/15.1

[56] References Cited

U.S. PATENT DOCUMENTS

| D. 302,265 | 7/1989 | Siegner et al. | D14/100 |
|---|---|---|---|
| D. 302,524 | 9/1989 | Siegner et al. | D14/114 |
| 4,159,402 | 6/1979 | DeGraauw et al. | 379/247 X |
| 4,639,557 | 1/1987 | Butler et al. | 379/29 |
| 4,670,898 | 6/1987 | Pierce et al. | 379/22 |
| 4,691,336 | 9/1987 | Durston | 379/21 |
| 4,707,848 | 11/1987 | Durston et al. | 379/1 |
| 4,825,392 | 4/1989 | Freeman | 364/550 |
| 4,837,811 | 6/1989 | Butler et al. | 379/96 |
| 4,843,620 | 6/1989 | Hagedorn | 379/21 |
| 4,922,516 | 5/1990 | Butler et al. | 379/21 |
| 4,949,290 | 8/1990 | Pike et al. | 364/580 |
| 5,025,466 | 6/1991 | Hilligoss et al. | 379/1 |
| 5,081,670 | 1/1992 | Reum | 379/28 |
| 5,105,438 | 4/1992 | Ackroff et al. | 375/8 |
| 5,121,342 | 6/1992 | Szymborski et al. | 364/514 |

OTHER PUBLICATIONS

Specialized Products Co., 1988 Fall Catalog, pp. 128, 132, 133, 135.
*Telephony* advertisement for "Terminal System 24", Sep. 1988, pp. 24–25.
*Teleconnect*, "Testing Equipment", Sep. 1989, pp. 78, 80, 83–88, 90.
Sivula, C., "GTE's New Line on Customer Service", *Datamation*, May 1, 1990.
"Dynatel 745 Product Profile" Specifications, 3M Corporation.
"965 Subscriber Loop Analyzer" Specifications, 3M Corporation.
"Plantronics Wilcom Model T136BSB", Product Brochure.

*Primary Examiner*—Stephen M. Baker
*Attorney, Agent, or Firm*—Townsend and Townsend Khourie and Crew

[57] ABSTRACT

An administrative computer and testing apparatus device is provided. The administrative computer is coupled to the testing apparatus so that the test data can be correlated with administrative information such as the location of the equipment tested. The administrative computer can control the testing apparatus to provide testing in accordance with predefined test procedures. The administrative computer is user-programmable to permit user-defined test procedures to be established. In one embodiment test data is provided to the administrative computer by using a memory buffer which can be written into by the test apparatus and can be read by the administrative computer. Test data, preferably test data correlated with the location information, can be communicated to a remote computer for further processing or analysis.

5 Claims, 9 Drawing Sheets

FIG. 11A

```
┌─────────────────────────┐
│   336       OHMS        │
│  ┌─────────────────────│
│  │ T-R: *    122.3 Ohms │
│382│ T-G:      27.00 kOhm │
│  │ R-G:>     40.00 kOhm │
│                         │
│    * EQUIVELANT LENGTH *│
│384│ T-R:  7552 ft       │
│  │ T-G:  HIGH RESISTANCE│
│                         │
│  CABLE GAUGE:    22 GA  │
│  TEMPERATURE:   68.0 F  │
│  CHANGE ? (Y/N)         │
└─────────────────────────┘
```
332

FIG. 11B

```
┌─────────────────────────┐
│   338       VOLTS       │
│  ─────────────────────  │
│  T-R: *   -52.0 V DC    │
│  T-G:       0.0 V DC    │
│  R-G:     -52.0 V DC    │
│                         │
│  T-R:       0.0 V AC    │
│  T-G:       0.0 V AC    │
│  R-G:       0.0 V AC    │
└─────────────────────────┘
```
334

FIG. 11C

272 — (R)VIEW (P)RINT (D)EL
274 — (S)TORE RESULTS

*(CURRENT RESULTS)

MONDAY TEST
TUESDAY TEST            } 258
MRS T 555-4631

12/21/90          12:30
STANDARD TESTS

1. VOLTS
2. OHMS
3. CAPACITANCE
4. STATION TEST
5. CIRCUIT LOSS
6. GAIN/SLOPE
7. CIRCUIT BALANCE

ENTER OPTION: _

12/21/90          12:30
CUSTOM TESTS

1. FULL PAIR TEST
2. NOISE TEST
3. QUICK TEST
4. CO STANDARDS

ENTER OPTION: _

12/21/90          12:30
UTILITY FUNCTIONS

354 — 1. MAINTAIN RESULTS
366 — 2. EDIT PARAMETERS
362 — 3. LOAD CUSTOM TESTS
164 — 4. SELF TEST

ENTER OPTION: _

ADMINISTRATIVE COMPUTER AND TESTING APPARATUS

BACKGROUND OF THE INVENTION

The present invention relates to portable apparatus which functions as an administrative computer, processing information relating to location or other administrative aspects of equipment to be tested, as well as having devices for performing the testing, of equipment.

A number of industries include, as part of their operation, field representatives or similar personnel who perform service calls, including traveling to locations where company equipment is installed. Service calls include calls for the purpose of testing, repairing and maintaining equipment, as well as calls for the purpose of gathering data such as usage and billing data, and sales calls. One example of a field representative is a repair person for a telephone company who travels to locations where telephone equipment is installed for the purpose of testing and/or repairing the equipment. In the past, companies with field representatives have provided them with administrative computers for assisting with administrative functions such as storing and displaying the location of the equipment to be tested, addresses of customers who have requested service, and the like. The information can also include equipment serial number or other identifying information, "trouble" ticket information such as information identifying a report of an equipment malfunction by customer name and date of complaint, telephone numbers, and other location-identifying information. Administrative computers can also provide functions such as scheduling or dispatching field representatives, billing, storing information about the service call, and the like. The administrative computers are often portable, and preferably, hand-held, that is, of sufficiently small size and weight that the computer can be held in one hand.

Although administrative computers have been used by field representatives, prior art administrative computers suffer from certain shortcomings. Typically, after an administrative computer has directed a field representative to make a service call, the field representative will make a report regarding the results of the service call. When the administrative computer is used in connection with making a report of test results, the field representative has been obligated to manually enter information into the administrative computer, usually by using a keyboard or keypad on the administrative computer. Such manual entry of information is time consuming and represents an opportunity for transcription errors. Further, in the past, the test-result information entered typically has involved only a summary or synopsis of test results. The consequent failure to record all test results represents a loss of valuable data which might have been used, for example, for statistical analyses of equipment reliability or making reports which are required by government agencies. Thus, if the company desires or requires such information, an additional service call may be needed to record the data which has already been obtained once.

An additional disadvantage of prior art systems is that the field representative's report must be manually correlated with "trouble ticket" information for the company to document that a customer complaint or report has been satisfactorily resolved. The manual correlation of "trouble tickets" with test results or other reports requires more time of the field representative and introduces another opportunity for error.

The above examples illustrate cases in which transfer of information regarding the service call into the administrative computer has required manual or human intervention. There are also instances of inefficiency resulting from transfer of information in the opposite direction, i.e., from the administrative computer to the field representative. For example, an administrative computer might contain information regarding the type of malfunction reported or the type of test which is required. In response to this information the field representative then manually configures test equipment to conduct the necessary tests. This configuration procedure requires additional time by the field representative and again represents an opportunity for introduction of error, particularly if the field representative misunderstands the type of tests which are needed.

Accordingly, there is a need for an apparatus which does not require the intervention of the field representative or any other manual manipulation or input to conduct testing in accordance with information stored in the administrative computer, and does not require intervention to report the results of a service call for storage or processing by the administrative computer.

SUMMARY OF THE INVENTION

The present invention includes a recognition of the problems and shortcomings of previous devices, such as those described above. According to the present invention, an administrative computer is coupled to testing equipment to enable test results to be automatically stored in the administrative computer, and automatically correlated with location information. The resulting system can automatically, or with only a small amount of user input, control the testing equipment to perform the desired tests.

In a preferred embodiment the administrative computer and testing apparatus are embodied in a single hand-held unit. In this unit, an interface is provided between the administrative computer and the testing apparatus which allows administrative computer control of testing and/or automatic storage of test results, correlated with location information, while still maintaining the hand-held configuration. Also in a preferred embodiment, the administrative computer is coupled to the remainder of the equipment, yet electrically isolated therefrom to protect from excess voltages or other potentially damaging signals.

In one embodiment, the invention includes apparatus for permitting the user to obtain electrical tests results relating to equipment which is to be tested. The apparatus includes an administrative computer which is programmed to store and display information related to the location of the equipment which is to be tested, a keyboard for user input, and testing apparatus. The testing apparatus is configured to measure a plurality of electrical parameters to be tested. Data transfer apparatus is provided for transferring information based on the test data into the memory of the administrative computer without manual entry of the information via the keyboard. Preferably, the administrative computer controls testing apparatus to conduct certain tests. The computer in the hand-held unit, thus, may, at any given time, be running an administrative application program. A test program which controls the test interface device, or potentially, a program which integrates the administrative and test functions as describe above.

According to another embodiment of the invention, apparatus is provided in connection with a hand-held administrative computer for testing equipment. The administrative computer has a CPU, memory, display, and keyboard. The apparatus receives signals from the equipment to be tested and, introduces those signals to signal-conditioning equipment such as filters, then digitizes the information before conveying it to the administrative computer. The data from the received signals is preferably stored in a buffer memory in the administrative computer. The administrative computer reads data from the buffer memory and can combine and/or manipulate different test signals to obtain desired information regarding the equipment being tested. The results of the equipment testing are correlated with information stored in the computer, which relates to the location of the equipment to be tested.

In another embodiment of the invention, the testing equipment includes a plurality of relays which can selectively connect equipment test leads to signal conditioners such as filters. Under control of a stored program, the administrative computer can configure the relays to route the signals received from the test leads through various signal conditioners and to analog-to-digital converters before the resultant digital indications of test results are stored in the administrative computer memory.

The present invention also provides a system by which the administrative computer, in response to information stored in the administrative computer and/or in response to user input, can perform one or more pre-defined tests or series of tests. The system includes capabilities for a user to pre-define tests to be performed and/or measurements to be obtained in a manner consistent with tests and outputs of pre-defined procedures. One embodiment of the invention includes a method for obtaining electrical test results relating to equipment which is to be tested comprising: providing an administrative computer programmed to store and display information related to the location of the equipment which is to be tested; providing a keyboard, coupled to the administrative computer, permitting user input to the administrative computer; providing testing apparatus configured to obtain data indicating values of a plurality of electrical parameters of the equipment which is to be tested; providing a memory for storing information; providing data transfer apparatus; transferring first information based on data into the memory, in the absence of manually inputting the first information using the keyboard; using the testing apparatus to conduct a first test to obtain the value of a first electrical parameter; repeating the first test until the value of the first electrical parameter is within a predefined distance of all of a first number of immediately preceding values; using the testing apparatus to conduct a second test to obtain the value of second electrical parameter; and repeating the second test until the value of the second electrical parameter is within a predefined distance of all of a second number of immediately preceding values, the second number being different from the first number.

BRIEF DESCRIPTION OF THE DRAWINGS

FIGS. 11A through 11I illustrate text screens used in conjunction with the present invention.

DETAILED DESCRIPTION OF THE PREFERRED EMBODIMENTS

The present invention includes an administrative computer and apparatus for obtaining electrical test results. According to a preferred embodiment, the administrative computer is a hand-held administrative computer which includes a CPU, a memory, a keyboard for input, a display for output and a portable power source. The administrative computer may be programmed (such as by downloading from a central computer) to store information relating to the service call, including the location of the equipment, customer name and other customer information, trouble ticket number, the nature of the problem reported, scheduling, and other dispatching information. It also can store telephone numbers such as remote computer numbers for modem connections, telephone company test numbers and the like. The administrative computer preferably is powered by rechargeable batteries.

In one embodiment, the administrative computer is a hand-held administrative computer Model T4000 sold by ITRON, Inc., Spokane, Wash. The T4000 is a microprocessor based computer provided with random access memory (RAM) and powered by a rechargeable battery. The CPU is preferably Model 80C88 produced by Motorola, Inc. The T4000 includes a keyboard and an LCD display. The T4000 also includes two serial ports and a modem.

Figure 1:
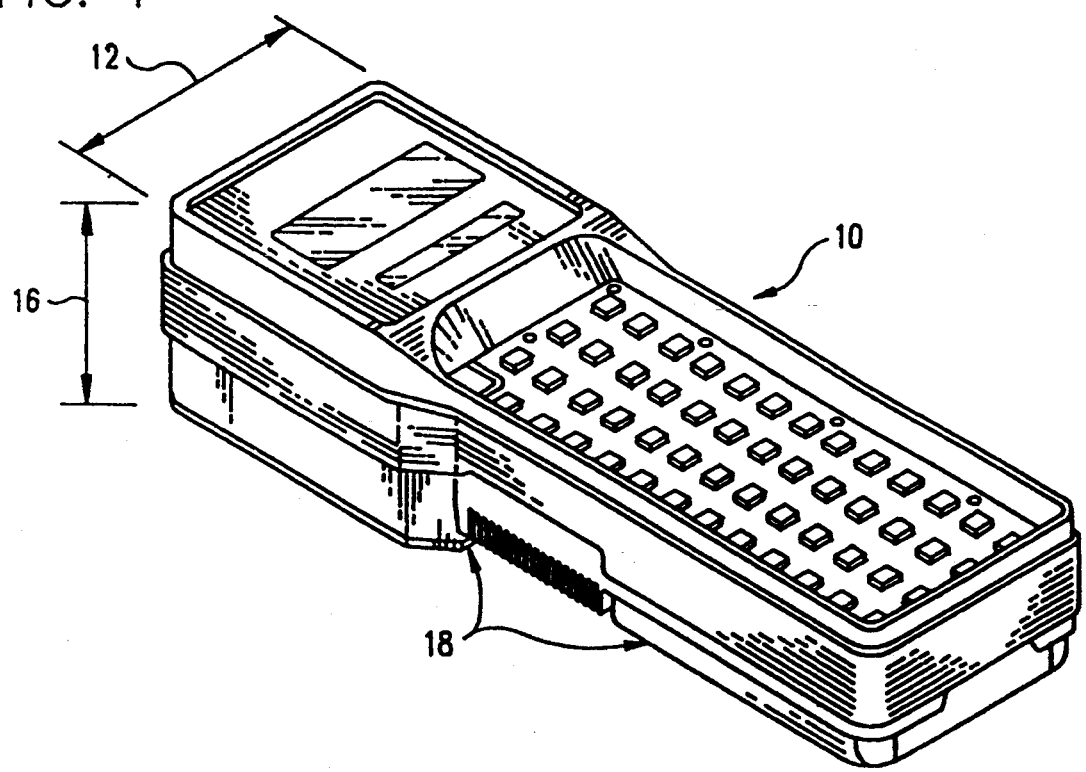
FIG. 1 is a perspective view of a hand-held administrative computer.
Figure 2A:
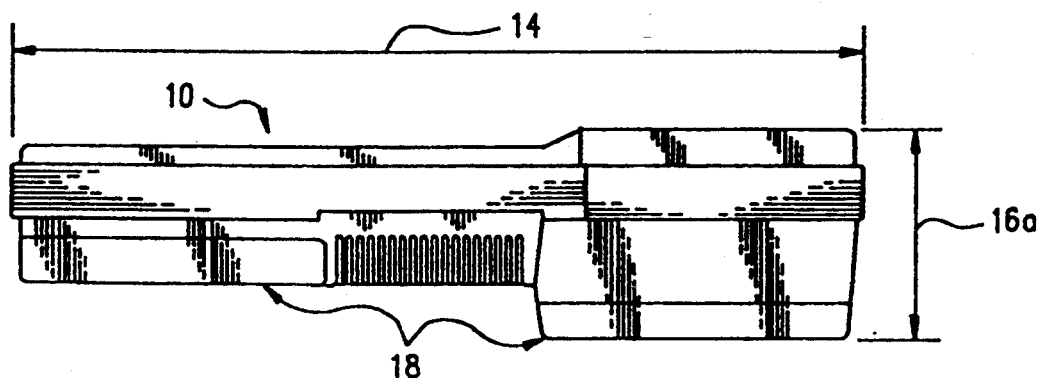
FIG. 2A is a side view of the computer of FIG. 1.
Figure 2B:
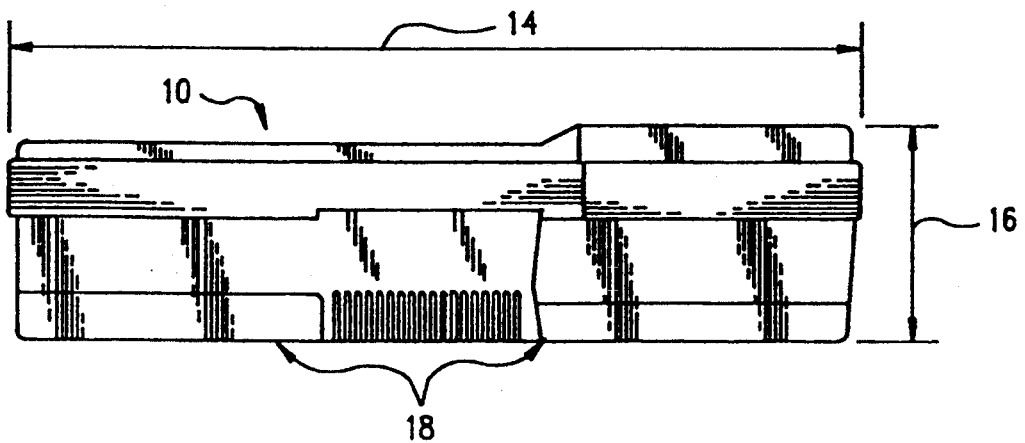
FIG. 2B is a side view of apparatus according to one embodiment of the present invention.

FIGS. 1 and 2a depict the external appearance of one model of the T4000. (See Design Patent Des. 302,265.) The T4000 10 has a width 12 of about 4.0 inches, a length 14 of about 11.5 inches, and a depth 16a of about 3.0 inches. The back covers 18 of the T4000 are removable. FIG. 2b depicts the appearance of a preferred embodiment of this invention described below.

Figure 3:
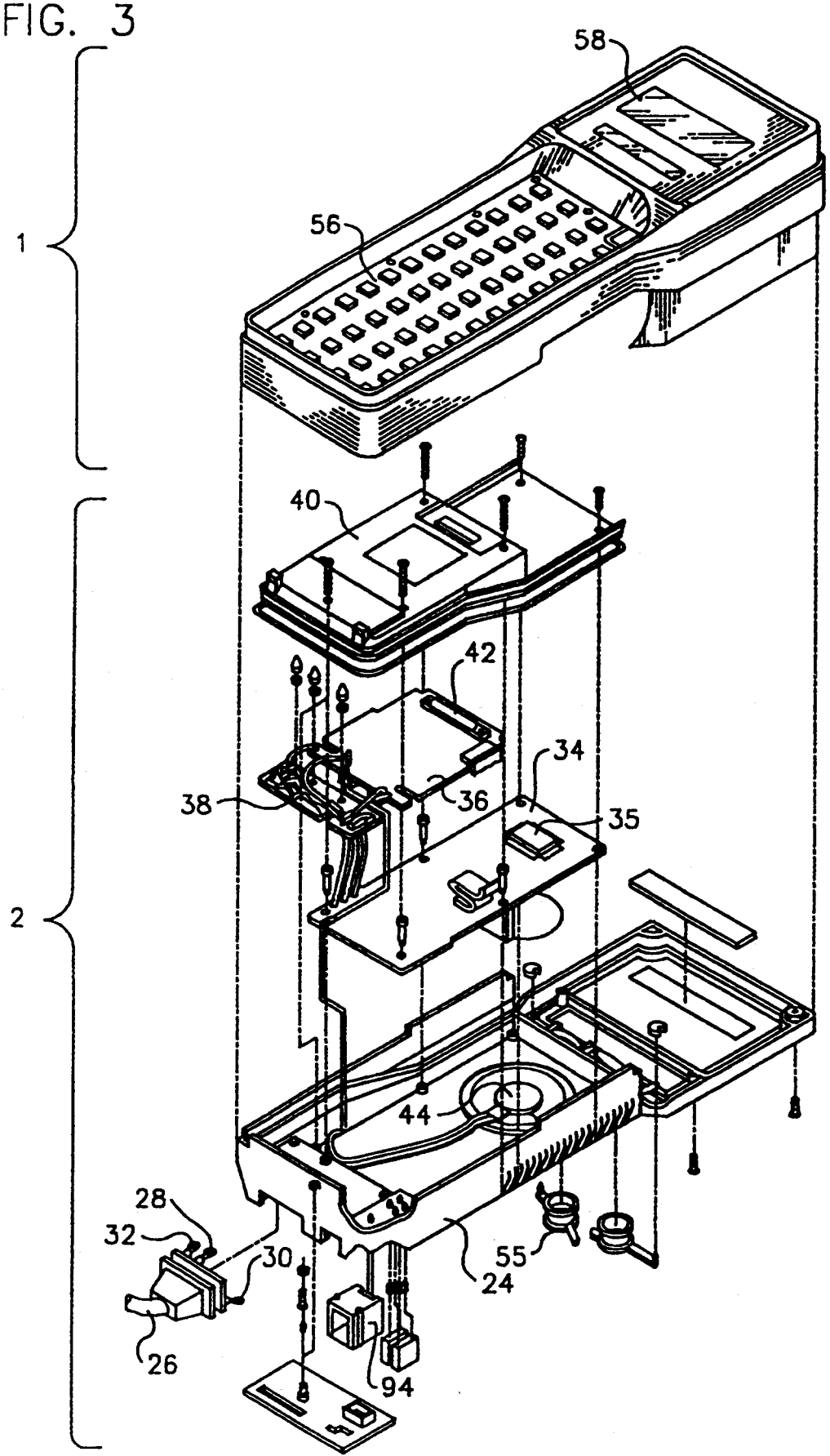
FIG. 3 is an exploded, perspective view of apparatus according to one embodiment of the present invention, with portions broken-away to show interior components.

As shown in FIG. 3, the present invention preferably includes an administrative computer 20 and a field service module or FSM 22 which can be integrally coupled to the administrative computer 20 after removing the bottom covers 18. Preferably the FSM is sufficiently small and lightweight that, after it is coupled to the T4000, the resultant apparatus is a hand-held device with external dimensions nearly the same as the external maximum dimensions of the administrative computer. In the preferred embodiment, the depth 16 of the apparatus in the region of the keyboard will be about equal to the depth 16a of the T4000 in the region of the display.

For the embodiment shown in FIG. 3, the FSM includes a housing 24; a test lead cable 26, having tip, ring and ground terminals 28, 30, 32; three printed circuit board assemblies; and a cover assembly 40. The assemblies include an analog board 34, a digital board 36, and a protection board 38. The FSM 22 is coupled to the administrative computer 20 by a system connector 42 which is positioned on the digital board 36. A corresponding mating connector (not shown) resides in the administrative computer 20. In the preferred embodiment, the connector 42 is a multi-pin connector which provides interconnections for data, addresses, control signals, power, and ground.

The digital board 36 provides interfacing to the administrative computer, including control of communication links. The analog board 34 houses the analog circuitry necessary for performance of the tests, and includes analog to digital converters. An infrared link allows the administrative computer to communicate to other equipment external to the hand-held unit, for example, to a "cradle" where the unit is stored. The protection board 38 houses input and protection circuits such as fuses and some I/O ports. Preferably, the protection board 38 is configured to be easily and inexpensively replaceable in case of over-voltage damage. The housing 24 includes a speaker 44 which is used for audio reproduction, such as reproduction of telephone line signals.

Figure 4:
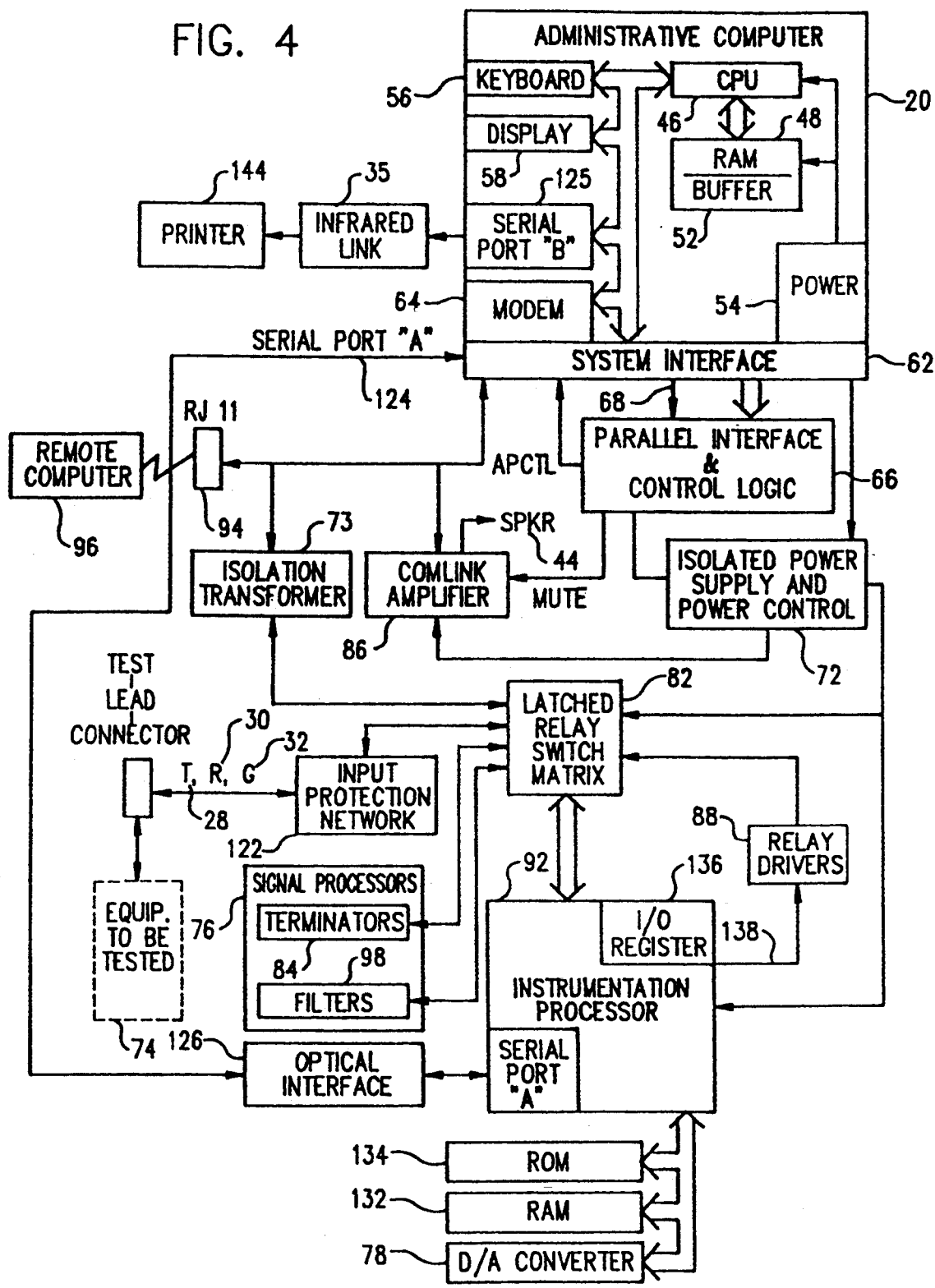
FIG. 4 is a schematic block diagram of the apparatus according to one embodiment of the present invention.

FIG. 4 is a functional block diagram of the apparatus depicted in FIG. 3. The administrative computer 20 includes a CPU 46, a memory 48, including a buffer portion 52, a battery power supply 54, a keyboard 56 and liquid crystal display 58. A system interface 62 includes the coupler 42 (FIG. 3) which is connectable to the mating coupler of the administrative computer 20. A modem 64 is included in the administrative computer for communication with other computers. The power supply is in the administrative computer 20 and includes a rechargeable NiCad battery pack. Power is supplied to the analog board 34 from the digital board 42.

The FSM 22 includes parallel interface and control logic 66 with registers required for bit-level power control to the FSM and volume control to the audio ("comlink") amplifier. A transformer-isolated power supply and power control 72 is used to power all test circuitry and interfaces, including relay coils.

Signals received from the equipment to be tested 74 over the test lead connector through the input protection network 122 can be processed by using signal processors 76 or digital to analog converters 78. The test lead connector 28, 30, 32 provides for attachment of the tip, ring and ground test leads and probes 26, while a matrix of relay switches 82 effects the desired connections. The latched relays route signals between the test lead inputs 28, 30, 32 and the appropriate instrumentation circuitry. Relays in the matrix are also used to select proper termination elements 84, other signal conditioning circuits 76, and to connect the test leads to the comlink amplifier 86 and to the modem 64. When filters 98 are employed for making measurements, all filters are turned on and off through commands passed from the administrative computer 20 to the instrumentation processor 92 via a serial command protocol. To minimize operating current, the relays in the relay matrix 82 are preferably latching relays, with each latching relay having a set and a reset input.

Relay driver transistors 88 are used to interface the instrumentation processor 92 to the relay switch matrix 82. Two drivers per relay are used, one each for the set and the reset coils. The relays are set by writing a bit configuration representing the desired relay configuration to an I/O register 136 which controls the relay drivers.

An RJ11 connector 94 is provided on the FSM 22 for connecting the modem 64 and the audio amplifier 86 to a telephone line through a conventional telephone cable. The RJ11 connector 94 also permits the administrative computer 20 to connect with a remote computer 96, for example, to download test result information and trouble ticket information. The RJ11 connector 94 can also be used in support of a Craft Access System (CAS). The Craft Access System is a telephone central office system which can be used for remote computer access to information such as customer service request information. Another use of the RJ11 connector 94 is for dialing telephone company numbers to request provision of a test signal over telephone lines to the equipment to be tested 74. The test leads 28, 30 can also be used for dialing.

The input protection network 122 includes fuses combined with varistors to protect the operator and the instrument. The audio amplifier 86 is a power amplifier with a programmable gain and mute function. The amplifier 86 and speaker 44 provide the function of monitoring for speech on the line and call progress monitoring when the modem is in use. The audio amplifier 86 is capacitively coupled to the FTIP and FRING lines from the modem 64. Preferably the audio monitor function may be used independently of the test mode.

The instrumentation processor 92 is controlled by means of serial commands from the administrative computer 20. The processor 92 generally acts as a slave processor to the administrative computer 20, receiving and executing internal and external hardware setup commands, performing measurements of analog signals appearing at the test link connector input, and transmitting the results of these measurements back to the administrative computer 20 across the serial interface 124. Depending on commands received from the administrative computer 20, the instrumentation processor 92 will configure its internal hardware appropriately for the measurement being undertaken. In certain "submodes" (e.g., "auto ranging") this internal configuration will be transparent to the administrative computer software and to the user. The serial interface 124 between the instrumentation processor 92 and the administrative computer 20 is preferably, optically isolated 126 bidirectional, asynchronous, half-duplex. The administrative computer also includes a serial port "B" 124 which can be used, preferably via an optical interface 35, to supply data to a printer 144. There is galvanic isolation between all hardware connected to the test functions, including the instrumentation processor, and the T4000 for operator safety.

Serial communication is preferably conducted using RS-232C format. Communications consist of two parts: a command sequence and a response sequence. The command sequence of the administrative computer will not transmit a command without first receiving an inquiry sequence from the instrumentation processor. To interrupt the instrumentation processor, the administrative computer 20 will initiate a break condition by causing the transmit line to be held in a low state (rather than the normal high or marking condition). The instrumentation processor 92 checks for this condition periodically during the measurement process. Upon detecting this condition, the instrumentation processor 92 aborts any current measurement, issues the inquiry sequence, and monitors the line 124 for a subsequent command.

The instrumentation processor 92 includes a microprocessor with on-chip random access memory 132 and read only memory 134 which is used for storage of program information. The processor is a high-speed, eight-bit microprocessor. Among the functions of the instrumentation processor 92 are: converting a pulse train from the A/D converter 78 to the appropriate value; adjusting A/D scaling factors to perform autoranging and polarity adjustment; controlling relay settings; communicating with the administrative computer 20; interpreting voltages into appropriate current, capacitance, ohms, etc. and, performing frequency counts in the frequency counting mode.

In one preferred embodiment of the present invention, the apparatus is configured for use by telephone company field representatives for use in testing telephone equipment. Software contained in the administrative computer is used not only for performing the administrative functions previously described, but also for conducting and controlling testing, correlating test results with location information and other administrative information, closing out trouble tickets and/or downloading information to remote computers for administrative functions.

In the preferred embodiment, users can choose from among a standard set of test routines or can write and store their own test routines. This provides a capability for the user to make the apparatus function the way the user desires, in a manner consistent with the operating procedures of the user. Using the software, test data can be selectively stored in memory and later printed or communicated to another processor for further analysis.

In operation, a technician connects the three test leads of the apparatus to a telephone line and either manually or automatically performs a series of line tests to diagnose any problems. The results of these tests are stored so they can be reviewed, saved, or printed when the testing is complete.

Figure 5:
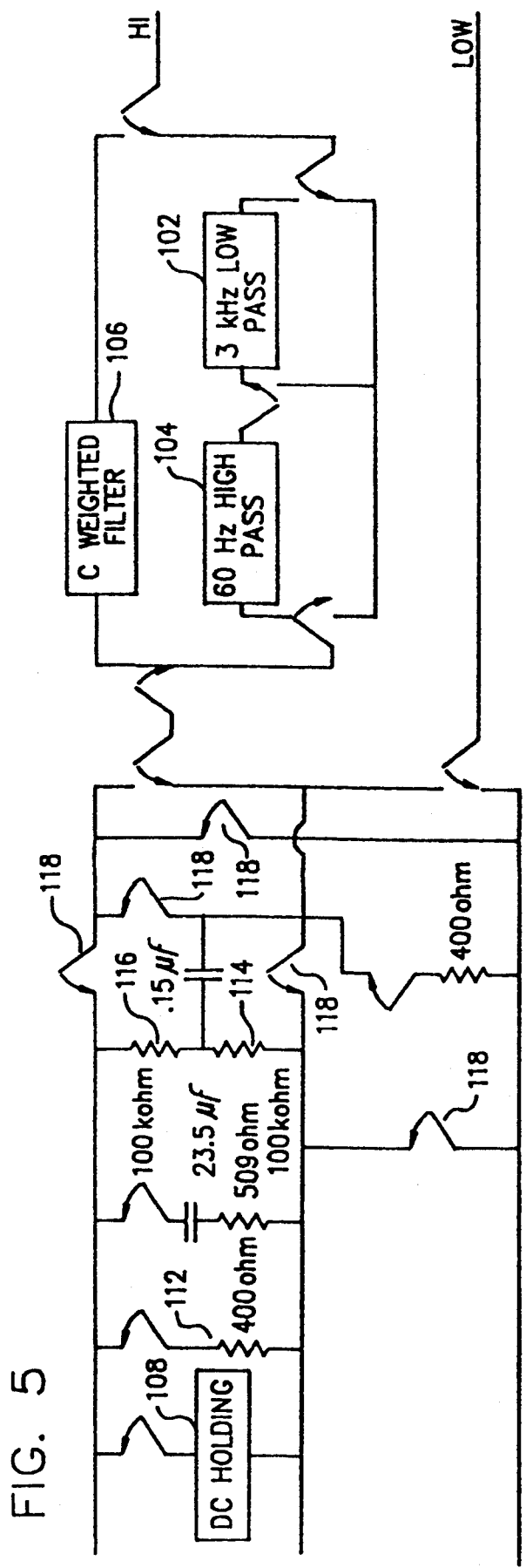
FIG. 5 is a schematic block diagram of the filters and terminators of FIG. 4, according to one embodiment of the present invention.

FIG. 5 is a schematic diagram illustrating an example of the technique for providing various filters 98 and terminators 84. Of course, other networks can be used depending upon the desired interconnections among the filters and terminators. In the embodiment depicted, the filters are: a 3 kHz low-pass filter 102; a 60 Hz high-pass filter 104; and a C-message weighted filter 106 which is a filter provided in accordance with IEEE Standard 743-1984106. Other well known filters or other signal processing elements also can be employed. Signals can also be connected "flat" (no filter applied). Any of these filters or the flat connection can be used with any of the terminations (described below). As depicted in FIG. 5, the FSM 22 is equipped with telephone-specific load and bridge terminations to allow accurate measurement of analog telephone lines.

In one embodiment the terminations include a DC holding circuit 108 takes the phone line off the hook by drawing a constant current. The holding circuit provides a high AC impedance to the line so that it can be used in conjunction with the 600 ohm AC termination for noise testing. A 430 ohm 5W resistive termination 112 places a load across tip and ring and to measure loop current. A 600 ohm AC termination 114 puts 600 ohms across tip and ring. This termination is used to load the line for AC measurements for noise and circuit loss. A 100 Kohm 0.25 W termination circuit 116 puts 100 Kohms in series with tip and ring to measure power influence. Input lead connections (tip to ring, tip to ground, ring to ground) 118 short any two selected input leads together for internal diagnostic testing and power influence.

Figure 6:
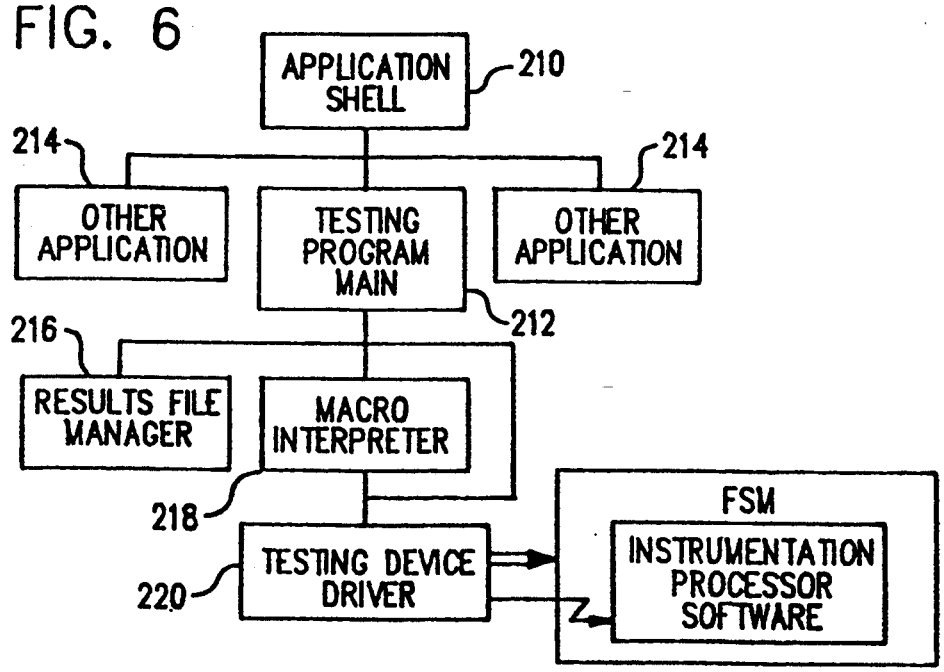
FIG. 6 is a block diagram of the major components of a software-directed method according to one embodiment of the present invention.

The major subsystems of the testing program system are shown in FIG. 6. The application shell 210 provides user access to the various capabilities of the device. In one embodiment, the application shell includes a menu system from which the user can select among the testing program 212 and other applications 214. Examples of other applications are the Craft Access System applications, applications providing similar functions such as VT100, as well as other well known software.

Figure 11G:
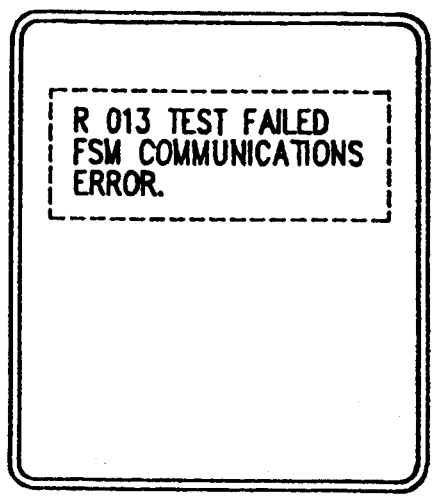

Of course, many different types of screen displays can be used during operation of the testing program. Typical display screens are shown in FIGS. 11A–11F. Static presentation screens, for example, as shown in FIGS. 11A and 11B, present information to the user such as results of tests. Data entry screens, for example as shown in FIG. 11C, allow the operator to review, print, store, or otherwise manipulate data. Menu screens, for example as shown in FIGS. 11D, 11E and 11F, present options to the user for selection. Error message screens, for example as shown in FIG. 11G, explain hardware or software problems to the user. Of particular benefit to the administrative system described here are measurement screens which present continuous, minimum, maximum, or average readings of a measurement, and can present analog bar graphs for the present values. In the preferred embodiment, continuous measurement screens are used with voltage, resistance and capacitance tests, and also may be used with custom tests.

The testing program main module 212 (FIG. 6) presents the testing system to the operator. This module 212 controls test selection and execution, system parameter modifications, print functions, retrieval, review and editing of test results. The testing program main segment 212 also contains system functions that are not directly related to manipulating test measurements such as maintenance functions and downloading of new test macros from another processor. As shown on FIG. 6, the testing program main module 212 is connected to a results file manager 216, a macro interpreter 218, and a testing device driver module 220.

The results file manager 216 is software which provides data access routines to its various components of the system. Typically, results data are stored in two memory buffers—one buffer contains current results that are saved or discarded at the end of a test session, and the other buffer contains named tests results from previous test sessions.

The macro interpreter 218 receives macro commands, interprets the macro commands, and executes the specified test macro. The interpreter 218 executes the macro until the test is aborted or completed and then returns control to the main module 212. The testing device driver 220 is responsible for communications between the administrative computer 20 and the FSM 22 and for directly controlling the FSM hardware.

Figure 7:
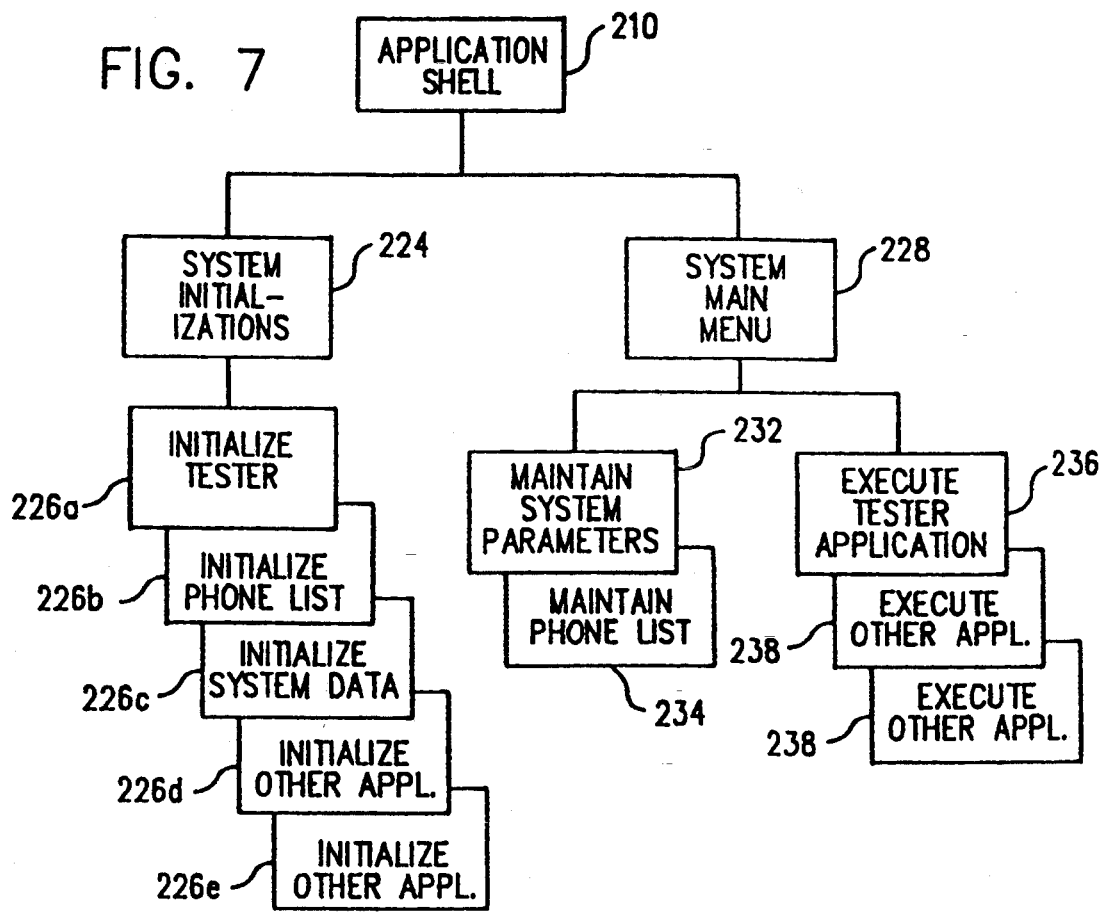
FIG. 7 is a block diagram of components of the application shell of FIG. 6.

FIG. 7 depicts the components of the application shell software. System initialization 224 is executed upon power up to perform system wide initialization.

Next, initialization routines 226A to 226E are called for each of the specific applications. Initializing the tester 226A includes setting the FSM to its default state. This function also calls the hardware driver 220 to perform a series of diagnostic commands to verify that the FSM is both present and operational.

Following initialization, a main menu 312 (FIG. 11I) is presented to allow the operator to choose one of the applications or an administration menu to perform certain non-test "housekeeping" operations. For example, the administration menu allows system parameters such as date, time and FSM type to be updated.

Another option of the main menu 312 in the preferred embodiment is an option 316 to display or revise a telephone list 234. Other options on the main menu can include an option 318 to execute the tester application 236 or options 322 to execute other applications.

If the tester application 236 (FIG. 6) is selected, the application shell 210 passes control to the tester program main module 212, which displays the testing program menu. The testing program menu (not shown) is similar to the other menu screens (FIGS. 11D, 11E, 11F, 11I) and allows choice of standard tests, custom tests, and utility functions. Selection of "standard tests" displays a standard test menu (FIG. 11D), "custom tests" displays a custom test menu (FIG. 11E), while "utility functions" displays a utility function menu (FIG. 11F). If the standard or custom test option is selected, control is passed by calling the main entry point for the testing program module 212.

Figure 8:
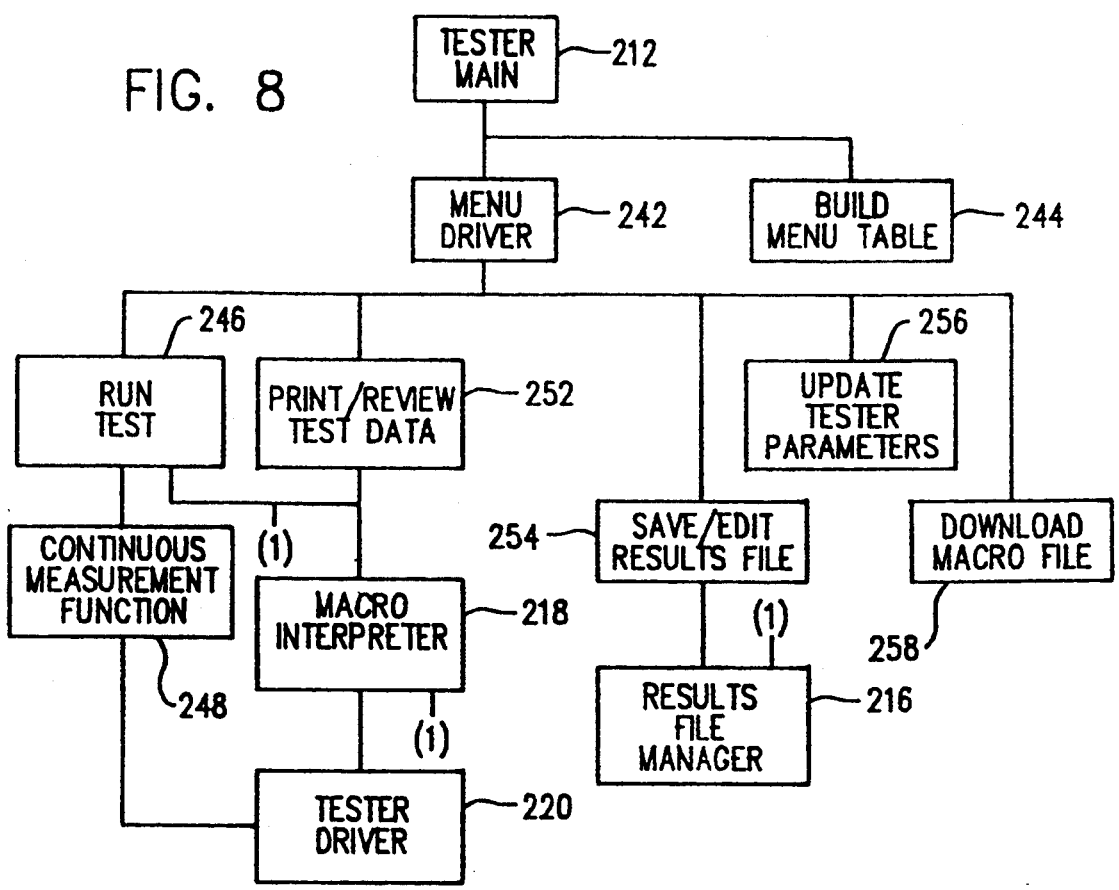
FIG. 8 is a block diagram of components of main tester of FIG. 6.
Figure 10:
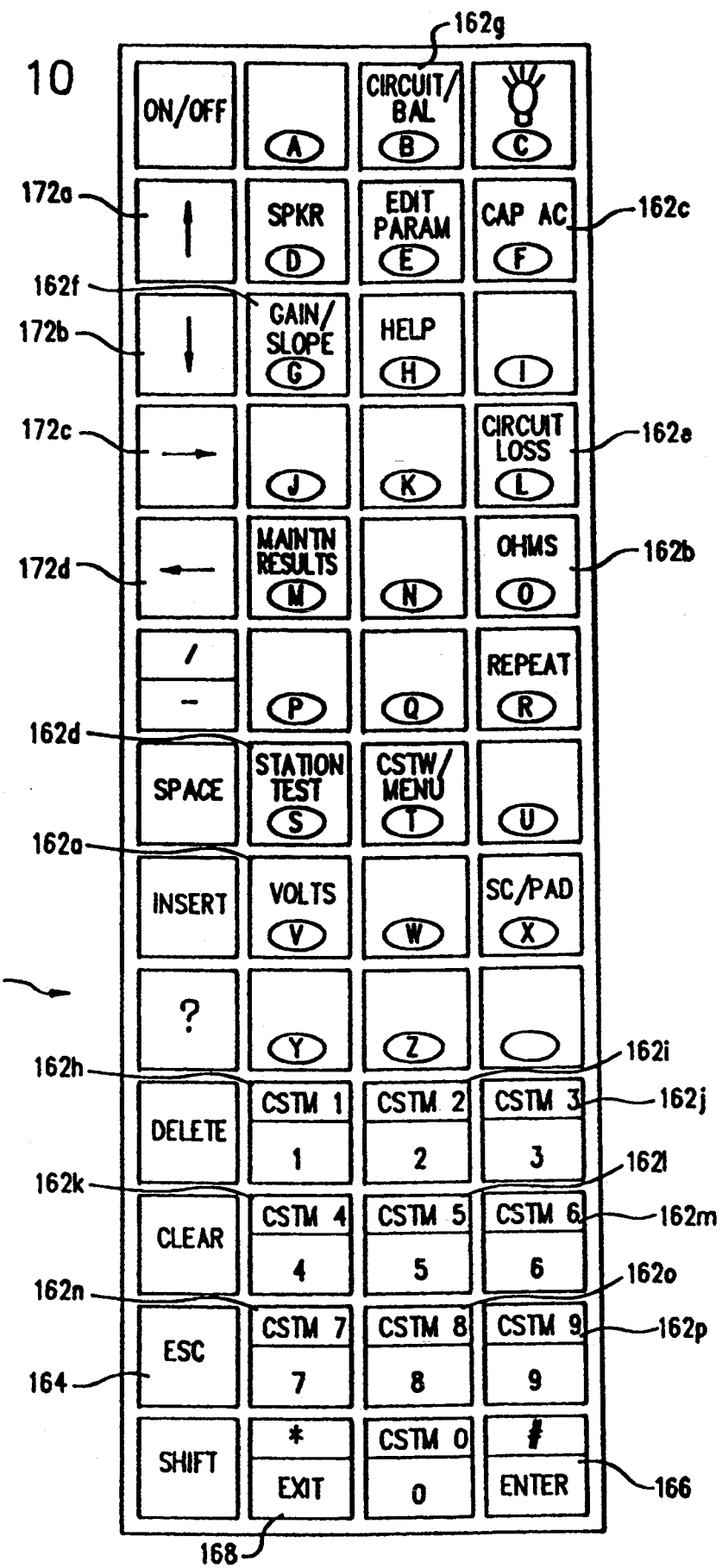
FIG. 10 depicts the keyboard according to one embodiment of the present invention.

FIG. 8 depicts the main components of the testing program main module 212. Once the tester main module 212 is entered, standard test menu 326 (FIG. 11D) or custom test menu 328 (FIG. 11E) created by the menu driver 242 is displayed. The operator can perform a series of different tests, optionally writing the test results to a buffer supplied by the calling application, until the exit function 168 (FIG. 10) is selected by the operator. The main menu module 212 provides a pointer to a buffer in memory that the application can use to pass test results back to the calling application. The calling application can then transfer the data to a host computer, process the data, or otherwise dispose of it.

The menu driver is a table-driven process 242. Because the menu options vary, depending upon the number of custom test macros defined, a single set routine handles all menus. Specific information about menu appearance and the actions to take for various selections is kept in a table of menu description structures. Each menu item has an entry in the menu table. The menu driver also handles activation of tester sub-functions through function keys. A function key pressed while a menu is displayed, causes the menu driver 242 to return back to the main menu 228 and execute the function associated with the key.

Many of the menus for the tester in the preferred embodiment are fixed so that tables that describe them can be pre-initialized. Because tests can be customized, however, some menu tables can be built dynamically using a building menu table function 244. This process 244 is executed the first time software is executed after being down loaded, and every time the test macros are modified.

Once the operator selects a specific test from the menu, the menu driver 242 passes this process to a pointer to the test macro to perform the test. The run test module 246 passes the pointer along to the macro interpreter 218 which controls execution of the macro.

The macro interpreter 218 processes the macro until the test is completed or the test aborts.

Once a test is selected, an information screen (FIGS. 11A, 11B) is displayed to communicate the test results. Continuous measurement is invoked from the test results screens 332, 334 that appear after executing a test. An "*" symbol 336, 338 appears next to one of the test results and, using "up" and "down" arrow keys 172a, 172b (FIG. 10), can be moved next to any test result line on the display. The Enter key 166 starts the continuous measurement and displays the value next to the * symbol. The continuous measurement function 248 continues to execute the macro until the operator stops it. In the preferred embodiment, the measure is displayed 342 as a bar graph 344, and arrow keys 172a, 172b can be used to change the scale of the graph. Minimum, maximum and average measurement values 346 are also displayed. In the embodiment depicted in FIG. 11H, the continuous current reading is displayed in larger characters than the minimum, maximum and average readings. The continuous measurement function 248 is told by the run test module 246 which measurement to display and only that measurement is displayed until the operator exits to the previous menu.

As a macro is executed, the interpreter 218 displays results (FIGS. 11A, 11B, 11H) and stores the measurements in the "current results" buffer in memory 132. Once the test is completed, the operator must press "Esc" 164 or "Exit" 168 to return to the previous menu. If the operator presses "Exit" 168 the results of the test are saved with the current results. If the operator presses "Esc" 164 the results are discarded. If an operator exits a continuous display with an "Exit" key 164, the minimum, maximum and average measurement results are saved in the "current results" file. Rather than using "Exit" or "Esc", to return to a previous menu, it is possible to run a series of tests by using a function key 162a–162p to start a new test. The results from the entire series of tests will be saved or discarded depending on whether "Exit" or "Esc" is pressed when the last tested series is completed.

Rather than performing a test, the operator may choose to print or review test data. To accomplish this, the user returns to the testing menu (not shown) and selects "utility functions". From the utility functions menu 352 the user selects "maintain results" 354. This will result in passing control to the print/review test module 252. This module reads the test results buffer, extracts the job names of previously saved results from the buffer and displays a data entry screen 256 (FIG. 11C). The job names are displayed 258 so that the operator can select the results to be reviewed. The data for each job consists of results of many tests. When the results are written, they are preceded by a test name that is used to interpret the results.

When the test results are printed 268 or replayed 272, the test macro that originally produced the results is executed again. When a test is replayed, a flag is set that tells the macro interpreter that whatever measurement directive is encountered, the measurement should be extracted from a results file in memory 48 instead of being read from the FSM 22. By providing for storage of a test macro or other storage of key strokes and storage of data (as opposed to storage of results screens), the code needed for software which permits review of data is shortened and simplified. A save/edit module 254 allows the operator to store 274 the current results which are not accessible by the calling application in the "permanent results" buffer 52 (which is returned to the calling application). It also allows the operator to delete 276 a previously saved set of test results. The results are assigned a "job name" when they are stored so that they can be retrieved by name at a later time. If a CAS system is the calling application the trouble ticket number will have been passed to the administrative computer as a job name.

The results file manager 216 exists to isolate the handling of the current results file. In this way, the storage format or access method or the results can easily be modified for applications that require different storage formats. This sub-system 216 consists of several functions for accessing the results file.

The Utility Menu 252 also includes options for loading custom tests 262, such as downloading from a remote computer 96, performing a self-test 164, e.g., to test open and shorted lead configurations, and to edit parameter 166.

A module 256 for updating testing parameters is provided. Upon execution, the current parameter settings are displayed and the operator manipulates a cursor to select and modify displayed settings. Examples of parameters which can be modified are units (e.g., feet or meters; Fahrenheit or centigrade), cable gauge settings (19, 22, 24, 25 or 26 gauge), cable type settings (jelly, air or paper), and cable temperature settings. A further module 258 displays a menu (not shown) that allows the operator to initiate a file transfer to load macro files into the administrative computer 20 through one of the serial communication ports.

The results file manager 216 consists of a number of independent functions. Each function performs a specific operation required by one or more modules in other tester subsystems. Among the functions performed by the results file manager 216 are: retrieval of current file position pointers, setting of current file position pointers, retrieving and setting current data record, appending new results data to a results file, deleting data from the current result position.

A macro interpreter 218 is a system by which all of the tests that can be performed by the tester are implemented (with the exception of the continuous measurement function). In the preferred embodiment, a syntax is established so that users can create programs that address their needs. When the macro interpreter 218 is called, a flag indicates that the test is in "run", "replay" or "print" mode. Each command is validated to determine if it is a recognized command. Among the functions which can be achieved by the macro interpreter are a "dial" process for dialing a telephone over the RJ11 connector, using the modem, the "hang up" command for hanging up the connection, a "print" command to display data on the screen 58, and a "pause" command.

Figure 9:
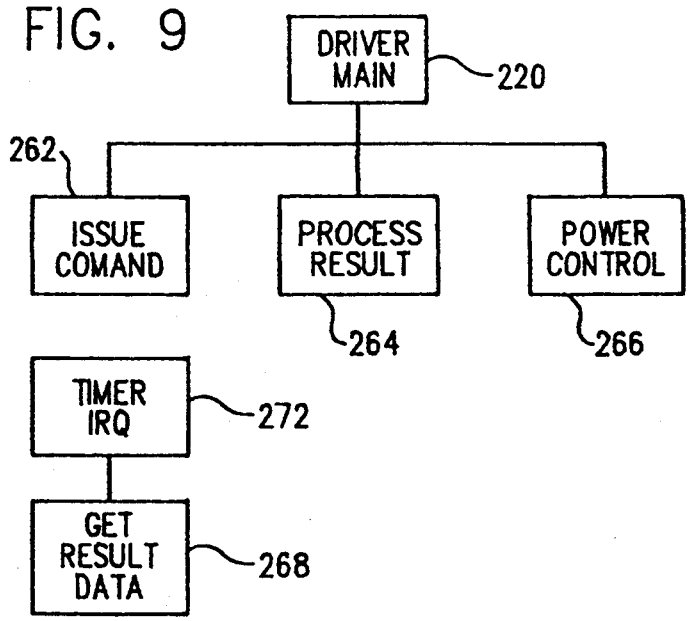
FIG. 9 is a block diagram of components of the driver of FIG. 6.

The tester driver module 220 provides a number of processes as depicted in FIG. 9. The main purpose of the driver is to provide an application interface to the function specific module (FSM) hardware. The driver 220 controls serial communication between the administrative computer and the instrumentation processor and also controls the relay and power configuration of the FSM. The driver 220 also interprets test results returned from the FSM. For example, in some tests, test results are not accepted as accurate until two successive readings are sufficiently close.

Procedures are also provided to conduct tests in a particular order. In some tests, testing starts at a low value and proceeds to a high value. In other cases, testing starts at a high value and proceeds to a low value. Another procedure involves statistically predicting whether a particular measurement is likely to be in a high range or a low range.

The main routine 220 (FIG. 9) calls the "issue command" process 262 to start a command, typically to set relays for a measurement. If the result is not returned before the time-out expires, the command will be retried. A fixed number of retries are attempted before the measurement is aborted. The time-out is detected when the main routine 220 attempts to get data with the "process result" module 264. Process result 264 waits for a response from the interrupt routine and converts the response to a floating point number and a status field. The power control function 266 is executed for power control commands in connection with the power control device 72.

The process results module 264 waits until the interrupt routine gets a complete result stream, then converts the stream to a numeric value. Once a result is returned, the status is checked to see if the result if valid. An error is returned if the status indicates that a valid reading cannot be obtained. If a valid reading has been taken, the result string is converted to a numeric value and that result is ranged, using the ranging information specified in the measurement control table. The "get result" data module 268 is executed off the timer interrupt 272. A pointer to this routine 268 is placed in the timer interrupt vector during initialization. Since measurement data is continually returned from the instrumentation processor once a command has been sent, this process 268 maintains a buffer which contains only the latest results. In addition, this routine 268 manages the serial protocol for received data. When a complete message has been received it is transferred to a result buffer that is used as "mail box" to transfer the data to the application portion of the tester driver, and a flag is set to indicate to the driver that the buffer contains a complete result.

Figure 11H:
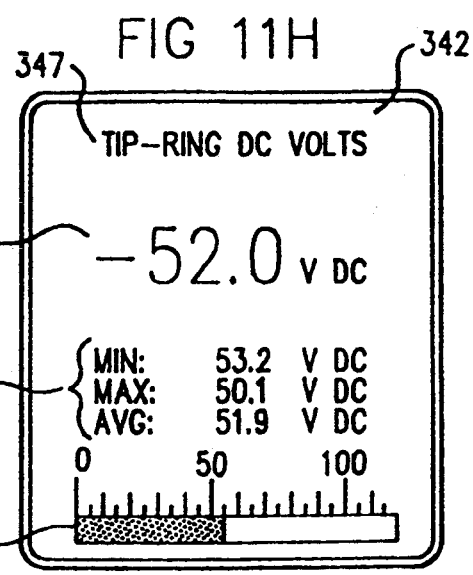
Figure 11I:
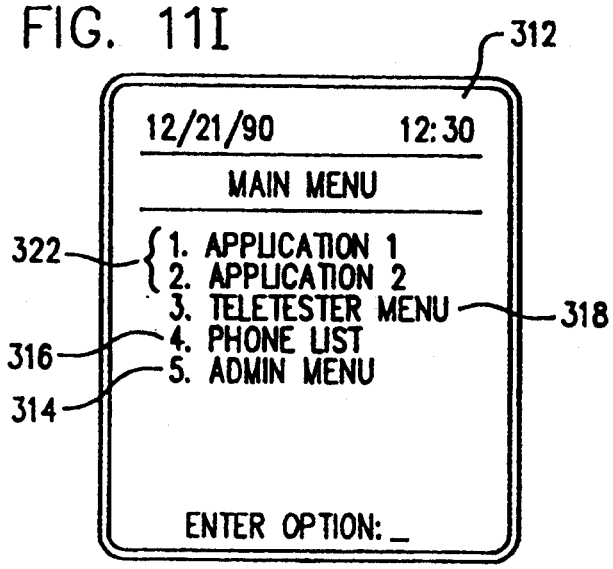

As noted above, the administrative computer can combine the fundamental test results to provide standard or custom test results. The available standard tests represent a suite of commonly-used tests for telephone instrument repair. The apparatus can be user-programmed to provide custom test result which combine fundamental tests as directed by the user-programming. The tests are set up to report the raw data for interpretation by a technician. This approach provides flexibility to the individual operating companies to exercise their own criteria. Each fundamental test is proceeded by voltage level safety checks on all leads to ensure safe operation by a field technician. Requested fundamental tests are then run and measurements displayed in the same format used to display standard tests (FIGS. 11A, 11B, 11H). Typically, multiple measurements are taken by the instrument automatically without additional intervention. This provides the greatest amount of information with the least amount of effort and time for logically grouped tests. For example, "voltage tests" runs voltage on all three possible line combinations, both AC and DC. Standard or custom tests can be selected using test keys 162a–162p (FIG. 10) from any menu. Standard tests are provided in the preferred embodiment.

As described, the present invention provides a single, preferably hand-held unit, which contains administrative computer functions and testing functions. This enables test results to be stored in the administrative computer and correlated with administrative information without manual data entry, thus saving operator time and reducing error. Testing functions are automatically controlled by the administrative computer, thereby assuring compliance with company-preferred test routines or government testing requirements. Automated test reporting of standard or custom testing routines is made possible.

Although a preferred embodiment of the invention for telephone testing has been described, the apparatus can be used in other contexts such as for electric, gas, water or other utility repair, billing or data gathering. Testing other than electrical parameter testing can be used or included, such as chemical, medical, biological, physical or other testing. The scope of the invention is described in the following claims.

What is claimed is:

1. In a hand-held administrative computer, the computer including
   a central processing unit;
   a memory, coupled to the central processing unit;
   a display, coupled to the central processing unit, for displaying information relating to the location of equipment to be tested;
   a keyboard, coupled to the central processing unit, for receiving user commands to control the display;
   a method for performing testing on the equipment to be tested, the method comprising:
   receiving signals from the equipment to be tested;
   selectively storing information related to the signals received from the equipment to be tested in the memory of the administrative computer;
   reading, from the memory, the information related to the signals received from the equipment;
   correlating the information read from the memory with the information relating to the location of the equipment to be tested;
   receiving in the administrative computer a series of user commands from the keyboard, the user commands being commands for performing testing;
   storing an indication of the user commands in memory;
   displaying a review of previous testing by re-executing the user commands of which an indication has been stored and using the selectively stored information, without using signals currently received from the equipment to be tested.

2. In a hand-held administrative computer, the computer including
   a central processing unit;
   a memory, coupled to the central processing unit;
   a display, coupled to the central processing unit, for displaying information relating to the location of equipment to be tested;
   a keyboard, coupled to the central processing unit, for receiving user commands to control the display;
   a method for performing testing on the equipment to be tested, the method comprising:
   receiving signals from the equipment to be tested;
   selectively storing information related to the signals received from the equipment to be tested in the memory of the administrative computer;
   reading, from the memory, the information related to the signals received from the equipment;
   correlating the information read from the memory with the information relating to the location of the equipment to be tested;
   wherein the administrative computer controls the display to present a plurality of menus including a main menu which includes a testing option, a testing menu which includes a standard test option, a custom test option, and a standard test menu which includes options for a plurality of predefined tests.

3. In a hand-held administrative computer, the computer including
   a central processing unit;
   a memory, coupled to the central processing unit;
   a display, coupled to the central processing unit, for displaying information relating to the location of equipment to be tested; and
   a keyboard, coupled to the central processing unit, for receiving user commands to control the display;
   a method for performing testing on the equipment to be tested, the method comprising:
   receiving signals from the equipment to be tested;
   selectively storing information related to the signals received from the equipment to be tested in the memory of the administrative computer;
   reading, from the memory, the information related to the signals received from the equipment;
   correlating the information read from the memory with the information relating to the location of the equipment to be tested;
   sequentially displaying a plurality of values of an electrical parameter, as the electrical parameter of the equipment to be tested changes, according to a pre-determined display format, wherein said plurality of values of said electrical parameter include values determined using a pre-defined test;
   wherein the pre-determined format includes a display of a current value, a minimum value, a maximum value and an average value and a bar-graph display of the electrical parameter.

4. A method, as claimed in claim 3, wherein the current value display is larger than at least one of the minimum value, maximum value and average value.

5. A method, as claimed in claim 3, wherein the bar-graph is at the bottom of the display, the minimum, maximum and average values are above the bar-graph and the current value is above the minimum, maximum and average values.

* * * * *